(12) United States Patent
Gingrich

(10) Patent No.: US 10,734,568 B2
(45) Date of Patent: Aug. 4, 2020

(54) MILLIOHM RESISTOR FOR RQL CIRCUITS

(71) Applicant: Eric C. Gingrich, Elkridge, MD (US)

(72) Inventor: Eric C. Gingrich, Elkridge, MD (US)

(73) Assignee: NORTHROP GRUMMAN SYSTEMS CORPORATION, Falls Church, VA (US)

(*) Notice: Subject to any disclaimer, the term of this patent is extended or adjusted under 35 U.S.C. 154(b) by 4 days.

(21) Appl. No.: 16/171,049

(22) Filed: Oct. 25, 2018

(65) Prior Publication Data

US 2020/0136008 A1    Apr. 30, 2020

(51) Int. Cl.
*H01L 39/22*   (2006.01)
*H01L 39/12*   (2006.01)
*H01L 39/02*   (2006.01)
*H03K 19/195*  (2006.01)

(52) U.S. Cl.
CPC .......... *H01L 39/223* (2013.01); *H01L 39/025* (2013.01); *H01L 39/12* (2013.01); *H03K 19/1954* (2013.01)

(58) Field of Classification Search
CPC ........ H01L 39/223; H01L 43/08; G11C 11/44
See application file for complete search history.

(56) References Cited

U.S. PATENT DOCUMENTS

2005/0062131 A1* 3/2005 Murduck ............... H01C 7/006
                                                    257/536
2015/0043273 A1* 2/2015 Naaman ................. G11C 11/44
                                                    365/162
2019/0392878 A1* 12/2019 Murduck ............ G11C 11/1673

FOREIGN PATENT DOCUMENTS

WO    2012103384 A2    8/2012
WO    2017083154 A1    5/2017

OTHER PUBLICATIONS

International Search Report for PCT/US2019/051301 dated May 29, 2020.
Mazin A Khasawneh et al: 11 Josephson Junctions with a synthetic antiferromagnetic interlayer. arxiv.org. Cornell University Li Bra Ry. 201 Olin Library Cornell University Ithaca. NY 14853. May 13, 2009 (May 13, 2009) XP080324203.DOI: 10.1103/PHYSREVB. 80.020506 p. 1. left-hand column. line 30—p. 2. right-hand column. line 5; figures 1-3.

(Continued)

*Primary Examiner* — Daniel Whalen
(74) *Attorney, Agent, or Firm* — Tarolli, Sundheim, Covell & Tummino LLP

(57) ABSTRACT

A milliohm resistor is fabricated as a Josephson junction device that contains ferromagnetic or antiferromagnetic material of sufficient thickness to render the device entirely resistive between terminals. The device can have a resistance on the order of milliohms and can be consume a much smaller chip footprint than resistors of the same resistance fabricated using conventional resistive materials. Because the device can be fabricated without modification to processes used to fabricate reciprocal quantum logic (RQL) circuitry, it can easily be incorporated in RQL circuits to mitigate flux trapping or to perform other functions where very small resistances are needed. In particular, the device can burn off circulating currents induced by trapped flux without affecting the transmission of SFQ pulses through RQL circuitry.

20 Claims, 2 Drawing Sheets

(56) References Cited

OTHER PUBLICATIONS

J. W. A. Robinson et al: Enhanced Supercurrents in Josephson Junctions Containing Nonparallel Ferromagnetic Domains 11,Physical Review Letters, vol. 104, No. 20, May 1, 2010 (May 1, 2010), XP055695933,us ISSN: 0031-9007, DOI: 10.1103/PhysRevLett. 104.207001 p. 2, right-hand column, line 1—p. 4, right-hand column, line 12; figures 1-3.

Niedzielski Bethany M et al: 11 Use of Pd—Fe and Ni—Fe—Nb as Soft Magnetic Layers in Ferromagnetic Josephson Junctions for Nonvolatile Cryo, IEEE Transactions on Applied Superconductivity, IEEE Service Center, Los Alamitos, CA, US, vol. 24, Aug. 1, 2014 (Aug. 1, 2014), pp. 1-7, XP011544947, ISSN: 1051-8223, DOI:10.1109/TASC.2014.2311442 [retrieved on Apr. 7, 2014]. p. 3-p. 7; figures 1-7.

Weides M et al: 11 0bservation of Josephson cupling through an interlayer of antiferromagnetically ordered chromium 11, arxiv.org, Cornell University Library, 201 Olin Library Cornell University Ithaca, NY 14853, Jun. 16, 2009 (Jun. 16, 2009), XP080329581, DOI: 10.1103/PhysRevB.80.064508 p. 2-p. 5; figures 2-4.

\* cited by examiner

MILLIOHM RESISTOR FOR RQL CIRCUITS

TECHNICAL FIELD

The present invention relates generally to superconducting circuit devices, and specifically to a milliohm resistor for reciprocal quantum logic (RQL) circuits.

BACKGROUND

Superconducting electronics can be implemented to provide high-performance computing with low energy consumption. Many superconducting computing circuits, including those classed as reciprocal quantum logic (RQL) circuits, include loops that have (passive) inductors and Josephson junctions (as the active circuit elements) arranged so as to carry out logical functions.

Antiferromagnetism is a property of certain materials wherein, below the Neel temperature, the magnetic moments of atoms or molecules, typically related to the spins of electrons, can align in a regular pattern with neighboring spins (on different sublattices) pointing in opposite directions. Synthetic antiferromagnets (SAFs) are artificial antiferromagnets made of multiple thin ferromagnetic layers separated by a nonmagnetic layer. Dipole coupling of the ferromagnetic layers can result in antiparallel alignment of the magnetization of the ferromagnets.

Giant magnetoresistance (GMR), in which antiferromagnetism plays a role, is a quantum-mechanical magnetoresistance effect observed in multilayers composed of alternating ferromagnetic and non-magnetic conductive layers. The GMR effect can be observed as a relatively high electrical resistance when magnetizations of adjacent ferromagnetic layers are in a an antiparallel alignment state.

SUMMARY

One example includes a resistor having a first terminal made of a superconducting metal, a second terminal made of a superconducting metal, and a Josephson junction device electrically connected between the first and second terminals. The Josephson junction device includes ferromagnetic or antiferromagnetic material. The resistor has a resistance value of between about one milliohm and about fifty milliohms.

Another example includes a method of mitigating flux trapping in a reciprocal quantum logic (RQL) circuit. A resistor is fabricated in an inductive loop in the RQL circuit. The resistor has a resistance of between about one milliohm and about fifty milliohms. The resistor has a footprint of less than twenty-five square micrometers. The resistor reduces to zero, in between about one millisecond and about ten microseconds, current circulating in the inductive loop as the result of trapped flux.

Yet another example includes chip-fabricated device having a resistance of between about one milliohm and about fifty milliohms, and a fabrication footprint of less than twenty-five square micrometers. The device has a first superconducting metal layer forming a first galvanic terminal, a second superconducting metal layer forming a second galvanic terminal, and, between the superconducting metal layers, a barrier. The barrier is either a synthetic antiferromagnet (SAF) made up of two ferromagnetic material layers separated by a spacer layer, the ferromagnetic material layers arranged to have antiparallel magnetizations with respect to each other, or an antiferromagnet layer.

DETAILED DESCRIPTION

Although it is generally desirable in chip-fabricated superconducting circuits to eliminate sources of passive resistance in order to provide circuits of lower operating power, it may be desirable in certain circumstances to include passive resistances as a matter of design in order to alleviate undesirable side-effects of superconducting circuit operation or to permit specialized circuit operation. However, conventional resistive materials tend to have a resistance per minimum fabrication area square that is on the order of a few ohms, e.g., ten ohms or twenty ohms. Fabricating a very low resistance resistor, e.g., to provide a resistance of one ohm or less, e.g., to provide a resistance on the order of milliohms, out of conventional resistive materials can thus require impractically large plan-view device area that is expensive from a layout area standpoint, and which can also manifest parasitic capacitive or inductive side-effects in the circuit that may negatively impact circuit performance and may prevent a circuit from functioning as intended. A comparatively low-area milliohm resistor as described herein can be used in superconducting circuits and particularly in RQL circuits, for example, to absorb unwanted currents, for example, to eliminate flux trapping.

Figure 1:
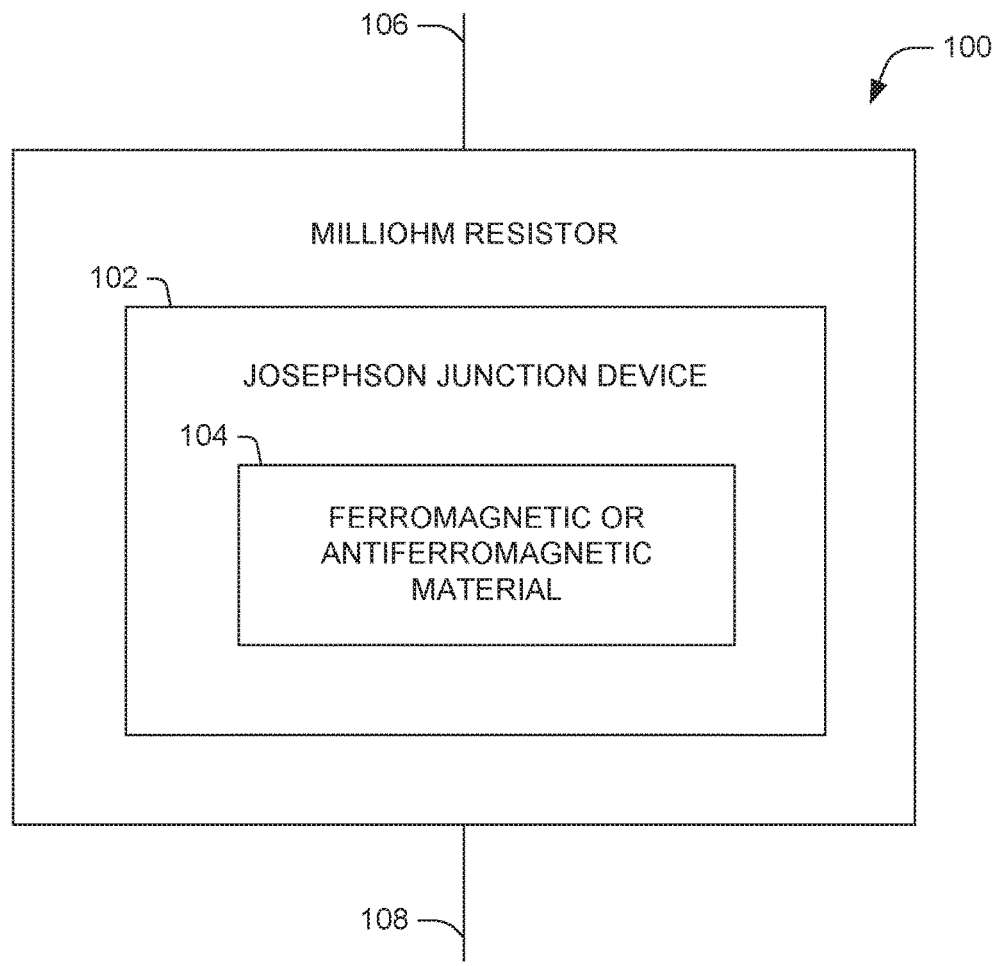
FIG. 1 is a block diagram of an example milliohm resistor for RQL circuits.

FIG. 1 illustrates a milliohm resistor 100 that comprises a Josephson junction device 102 that contains ferromagnetic or antiferromagnetic material 104 of sufficient thickness to render the device entirely resistive between terminals 106, 108. Accordingly, as the term "Josephson junction device" is used herein, such a device does not behave as a conventional Josephson junction, i.e., having a certain critical current above which the junction becomes resistive, and below which the device passes supercurrent. However, a "Josephson junction device," as that term is used herein, is fabricable in similar fashion to a Josephson junction, e.g., as a number of different-material layers, using compatible fabrication processes. Terminals 106, 108 can each be made of a superconducting metal, e.g., niobium, niobium nitride, or aluminum.

The resistance of device 102 can be tuned at fabrication time by adjusting the plan-view area of device 102 to provide a resistance value in the low milliohms to multiple tens of milliohms in value, e.g., between about one milliohm and about fifty milliohms, e.g., between about one milliohm and about twenty milliohms, e.g., between about one milliohm and about ten milliohms, e.g., between about one milliohm and about five milliohms. Accordingly, as the term "milliohm resistor" is used herein, such a resistor is not necessarily limited, except as otherwise specified, only to resistances of one milliohm or even to resistances of between one and ten milliohms. Milliohm resistor 100 can thus provide low resistance values not easily achievable in the RQL process. Device 102 can also include layer growth promoting outer spacer layers (not shown in FIG. 1) adjacent to the ferromagnetic or antiferromagnetic material 104.

Figure 2:
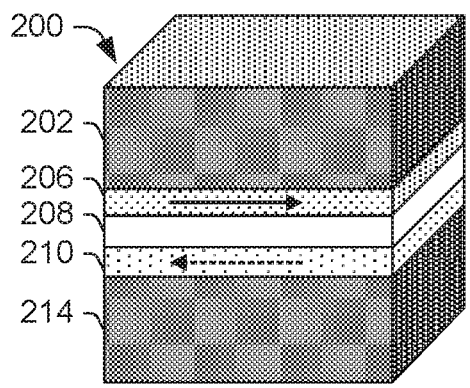
FIGS. 2-5 are layer diagrams for examples of the milliohm resistor of FIG. 1.
Figure 3:
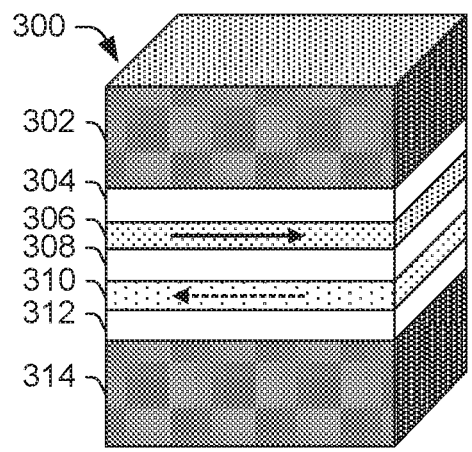
Figure 4:
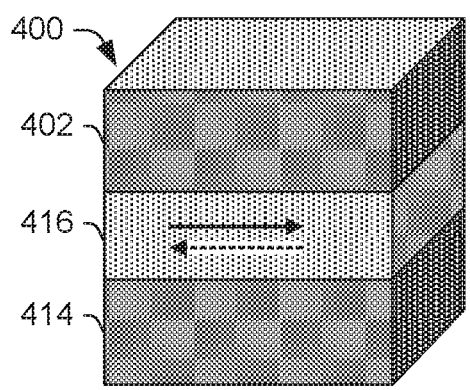
Figure 5:
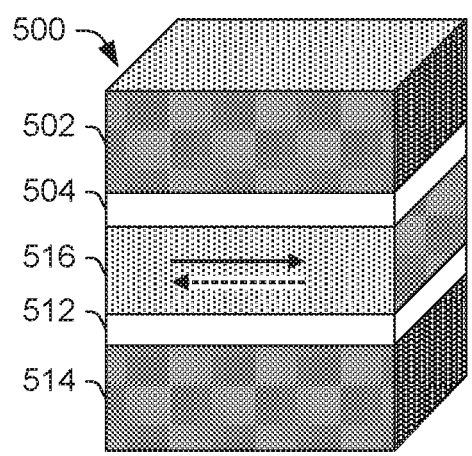

FIGS. 2-5 illustrate example layer configurations for devices 200, 300, 400, 500 that can each correspond to milliohm resistor 100 of FIG. 1. FIGS. 2 and 3 show example milliohm resistors constructed as synthetic antiferromagnet devices while FIGS. 4 and 5 show example milliohm resistors constructed as antiferromagnet devices. FIGS. 3 and 5 show milliohm resistors that include layer growth promoting outer spacer layers 304, 312, 504, 512, whereas FIGS. 2 and 4 show respectively similar devices that do not include layer growth promoting outer spacer layers. Each of examples 100, 200, 300, 400, 500 use ferromagnetic or antiferromagnetic materials, which, when made of the proper thickness and magnetization, can be efficient in suppressing superconducting currents, reducing the size of the device necessary to make an effective milliohm resistance. Use of the examples illustrated and described herein thereby allows small-footprint resistor devices to replace very large-footprint circuit structures that are otherwise necessary using conventional resistive materials.

In each of FIGS. 2-5, the area of the junction that determines its resistance corresponds to the size of the junction in the x-y plane, where a z axis normal to the x-y plane runs vertically through the junction from superconducting node to superconducting node, e.g., between elements 202 and 214 in FIG. 2. The fabrication area can be roughly square, e.g., with an x dimension no more than twenty percent different than the y dimension, e.g., no more than ten percent different than the y dimension. As examples, the area diameter of any of devices 100, 200, 300, 400, or 500 can be less than about five micrometers, e.g., between about half a micrometer and about three micrometers, e.g., between about one micrometer and about two micrometers. Accordingly, this disclosure provides a milliohm resistor that can have a footprint of less than about twenty-five square micrometers in area, e.g., less than nine square micrometers in area, e.g., about 0.25 square micrometers in area. Although FIGS. 2-5 illustrate the milliohm resistor devices as being square in shape in the plan view, these devices can be fabricated as other shapes, e.g., circular.

FIG. 2 shows an example milliohm resistor 200 having two superconducting layers 202, 214 on either side, sandwiching layers of ferromagnetic materials 206, 210, separated by a spacer layer 208. Layers 206, 208, 210 form a synthetic antiferromagnet (SAF) barrier. As indicated by the two opposing arrows in each of adjacent ferromagnetic layers 206, 210, the respective magnetizations of these layers are in an antiparallel alignment state to provide a relatively high electrical resistance. Structure 200 utilizes antiferromagnetic coupling between the two ferromagnetic layers 206, 210. Both ferromagnets 206, 210 can, for example, be the same material and about the same thickness (e.g., within ten percent of each other, e.g., within five percent thickness of each other), while spacer layer 208 can be any material that provides strong antiferromagnetic coupling, as discussed below.

Upper superconducting galvanic contact 202 and lower superconducting galvanic contact 214 in milliohm resistor 200 can each be made, for example, of a superconducting metal, e.g., niobium, niobium nitride, or aluminum. These layers of device 200 galvanically connect the device to other parts of a circuit in which the milliohm resistor 200 is implemented, e.g., a structure such as the one shown in FIG. 6.

Spacer layer 208 in milliohm resistor 200 can, for example, be made of any one of elemental copper (Cu), elemental ruthenium (Ru), elemental iridium (Ir), or elemental rhodium (Rh). Spacer layer 208 can have a thickness of, for example, between about 0.5 nanometers and about 1.0 nanometers.

Ferromagnetic layers 206, 210 can, for example, be made of any one of elemental cobalt, elemental iron, a cobalt-iron alloy (e.g., 1:1 CoFe), a cobalt-iron-boron alloy (CoFeB), a nickel-iron alloy (NiFe), a nickel-iron-niobium alloy (NiFeNb), a nickel-iron-chromium alloy (NiFeCr), or a nickel-iron-copper alloy (NiFeCu). In the case of each alloy mentioned, many different alloy concentrations can be used, provided that the alloy concentration is magnetic. The selection of materials for ferromagnetic layers 206, 210 and spacer layer 208 are interchangeable given appropriate selection of the layer thicknesses; thus, for example, the SAF barrier can be made with cobalt ferromagnetic layers 206, 210 and a ruthenium spacer layer 208, or, with appropriate selection of the layer thicknesses, can be made to work just as well with nickel-iron alloy ferromagnetic layers 206, 210 and a copper spacer layer 208.

Ferromagnetic layer thicknesses of about ten nanometers are sufficient to suppress all supercurrent in the junction 200. The ferromagnetic layers can therefore each be at least ten nanometers thick. The precise resistance of the junction can be adjusted by adapting the fabrication area of the junction. Spacer layer 208 should be fabricated to be of sufficient thickness to ensure antiferromagnetic coupling will prevent magnetic fields from causing failures in nearby digital circuits.

FIG. 3 illustrates a SAF-based example milliohm resistor 300 similar to milliohm resistor 200 of FIG. 2, the layers of which correspond to the similarly-numbered layers of the example device 200 illustrated in FIG. 2, and further including outer spacer layers 304, 312 to promote proper growth of the ferromagnetic layers, e.g., to thicknesses of between about two nanometers and about ten nanometers. Thus, superconducting layers 302, 312 are on either side of ferromagnetic material layers 306, 310, separated by spacer layers 304, 308, and 312. Again, both ferromagnets 306, 310 can, for example, be the same material and the same thickness, while spacer layer 308 can be any material that provides strong antiferromagnetic coupling. The materials and thicknesses of the layers can otherwise be as described above with respect to FIG. 2.

FIG. 4 provides an example milliohm resistor 400 that does not use a SAF barrier as in the examples of FIGS. 2 and 3, but instead uses an antiferromagnetic barrier layer 416 of appropriate material and sufficient thickness to completely suppress supercurrent between superconducting galvanic contact layers 402, 414. The lack of magnetic fields in device 400 comes as a consequence of the antiferromagnetism of the material used for antiferromagnetic barrier layer 416. The device 400 can be made either without outside spacer layers, as in FIG. 4, or with outside spacer layers 504, 512, as shown in milliohm resistor 500 of FIG. 5, which can be included to promote appropriate growth of the ferromagnetic layers. As in the previous examples 200, 300, example milliohm resistors 400, 500 include respective upper superconducting galvanic contact 402, 502 and lower superconducting galvanic contact 414, 514. As described previously, these contact layers can each be made, for example, of a superconducting metal, e.g., niobium, niobium nitride, or aluminum. Antiferromagnetic barrier layer 516 of milliohm resistor 500 in FIG. 5 can otherwise be structurally and functionally the same as described above with respect to antiferromagnetic barrier layer 416 of milliohm resistor 400 in FIG. 4.

Antiferromagnetic barrier layers 416, 516 can be made, for example, of ferromanganese (FeMn), ferrous oxide (FeO), ferric oxide ($Fe_2O_3$), nickel (II) oxide (NiO), manganese (II) oxide (MnO), manganese (IV) oxide ($MnO_2$), chromium (III) oxide ($Cr_2O_3$), or iridium manganese (IrMn). There are a wide variety of antiferromagnetic materials that can be used for antiferromagnetic layer 416, 516, and this list is not exclusive. Antiferromagnetic barrier layers 416, 516 can have thicknesses of, for example, between about ten nanometers and about fifty nanometers, e.g., about fifty nanometers. Antiferromagnetic barrier layers 416, 516 of lesser thicknesses can be effective, but thicker layers advantageously provide fabrication uniformity of the material layers (e.g., it is more practicable to achieve a one percent uniformity on five-angstrom variation than on one-angstrom variation).

Because a milliohm resistor as shown in any of FIGS. 1-5 can be fabricated as a junction layer like those already used in fabricating RQL technology, such resistors can be incorporated into RQL architectures to provide important circuit benefits without significant changes to the fabrication processes. The devices 100, 200, 300, 400 can also be implemented as a via plug between two superconducting layers, at the cost (or benefit) of somewhat higher resistances depending on the application.

A milliohm resistor as shown in any of FIGS. 1-5 addresses the problem that conventional resistance layers are limited to resistances of three orders of magnitude too large for some superconducting circuit applications. Incorporation of conventional resistive materials to provide resistances in the range of an eighth of an ohm in a design requires an extremely large parallel device network, but use of a milliohm resistor as shown in any of FIGS. 1-5, or several such resistances in series, permits for resistances on the order of milliohms or small fractions of an ohm to be achieved in a layout-area-efficient manner.

A milliohm resistor as shown in any of FIGS. 1-5 can be provided, for example, in a superconducting loop to provide enough resistance to eliminate "flux trapping," i.e., persistent superconducting current loops that may be inadvertently induced by, for example, routing of DC flux bias lines, as are found in RQL circuit designs, or as a result of thick layers of magnetic material and that could induce unwanted flux in a circuit. Flux trapping can occur, for example, during cooldown of a superconducting circuit, i.e., when such a circuit is being brought from room temperature, for example, to within operational temperatures (e.g., around four kelvins) within a cryogenic cold space. During cooldown, the transition to the superconducting state of niobium or other superconducting metal in the presence of a superconducting ground plane can cause magnetic flux that is in the system and that has not been shielded out to become trapped and pinned to circuit locations. If flux is pinned directly under a sensitive inductive loop, e.g., connecting two Josephson junctions together to perform some sort of logic, such flux can be induced into that loop, thereby potentially unintentionally affecting the logic of a loop, even, for example, changing an AND gate into an OR gate or vice-versa, and thus "breaking" the functionality of the superconducting circuit.

A trapped static flux induces a supercurrent upon the inductive loop that will persist in the loop indefinitely absent a resistance in series with the loop, in which case the supercurrent will no longer be a supercurrent and will "burn off" (i.e., be completely converted from electrical current to another form, such as heat) and, within a time that is dependent upon the value of the resistance, be reduced to zero. A loop-series resistance that is too high (e.g., on the order of ohms) can impede the propagation of single flux quantum (SFQ) pulses representing data or control signals and for which the time spent in any one inductive loop is typically on the order of picoseconds or nanoseconds.

By contrast, a loop-series resistance that is not too high (e.g., on the order of milliohms) will only burn off currents over a time scale of milliseconds or microseconds (e.g., between about one millisecond and about ten microseconds, e.g., between about ten milliseconds and one microsecond) and thus will not affect the intended propagation of such SFQ pulses because such SFQ pulses do not remain in any one loop long enough to be burned away by the milliohm resistor. As such, it is desirable that the loop-series resistance is not so high that it breaks the logical function of the inductive loop in which it may reside. A milliohm resistor can have a small enough resistance value that it has no impact on the logical application of the circuit, but over a large enough time scale, will burn off any unwanted supercurrents as may result from flux trapping.

Figure 6:
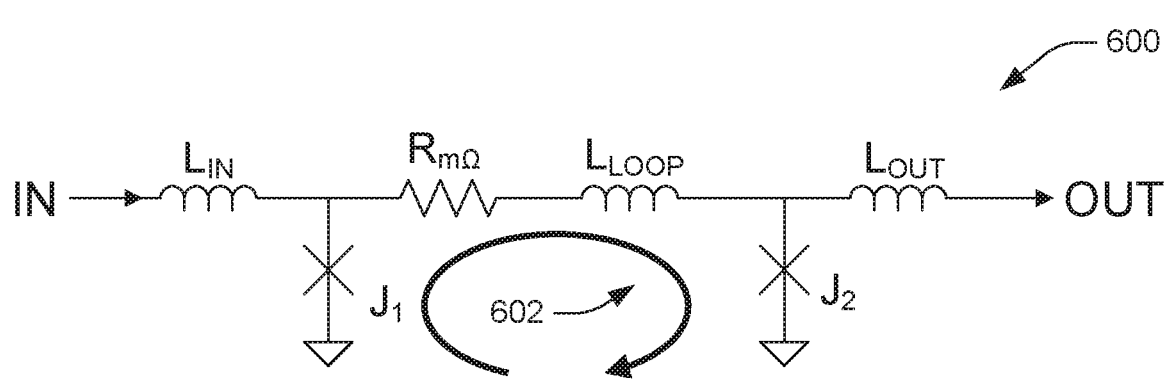
FIG. 6 is a circuit diagram of an example RQL circuit employing a milliohm resistor like that of FIG. 1 to mitigate flux trapping.

FIG. 6 illustrates use of a milliohm resistor $R_{m\Omega}$ that can correspond to any of previously illustrated devices 100, 200, 300, 400, or 500, in an RQL circuit portion 600 that can correspond, for example, to a part of an RQL gate, a Josephson transmission line (JTL) or a superconducting quantum interference device (SQUID). Milliohm resistor $R_{m\Omega}$ is in series with what would otherwise be a superconducting loop comprising first Josephson junction $J_1$, loop inductor $L_{LOOP}$, and second Josephson junction $J_2$. Circulating current 602 generated by trapped flux burns off (reduces to zero current) over a time scale of milliseconds or microseconds. An SFQ pulse introduced at input IN can be propagated into the loop (via input inductor $L_{IN}$) and out of the loop (via output inductor $L_{OUT}$) to output OUT within a time on the order of picoseconds or nanoseconds without being affected by milliohm resistor $R_{m\Omega}$.

As another example application, a milliohm resistor as shown in any of FIGS. 1-5 can also be provided to eliminate the DC load from a triggered Josephson junction without providing so much resistance as to completely shunt the Josephson junction. A milliohm resistor as shown in any of FIGS. 1-5 can otherwise be provided to permit the realization of sub-ohm resistances much more easily than is currently allowed for with the ohm-level resistors currently allowed by the present state of the fabrication technology. As an example, a large-current driver design can include "safety valve" circuitry, i.e., a low-resistance path for current to go under certain fail conditions, to prevent the large-current driver from being stuck in an "on" state. The resistance of the low-resistance path may, for example, need to be under a tenth of an ohm. An exceedingly wide resistor using conventional resistive metals may provide such a resistance, but is expensive from a layout area standpoint and not optimal. As an alternative, a number (e.g., ten) milliohm resistors of the type described herein can be provided in series to provide a sub-ohm resistor of the desired value in the circuit.

As another example of sub-ohm resistances used in circuit design, a milliohm resistor as described herein could be used to construct a circuit that takes advantage of timescale as a design variable. Thus, for example, a circuit can be arranged such that if two current pulses are input to the circuit within a first amount of time of each other, below a time threshold, i.e., such that the first current pulse has not been sufficiently burned off by the time of the receipt of the second current pulse, the circuit performs a first logical function (e.g., because a logical decision Josephson junction is sufficiently biased by the additive effect of currents from the two pulses, or because a logical decision Josephson junction is triggered by the additive effect of such currents), whereas if the two current pulses are input to the circuit within a second amount of time of each other, above the time threshold, i.e., such that the first current pulse has been sufficiently burned off by the time of the receipt of the second current pulse, the second performs a second logical function distinct from the first logical function (e.g., because the logical decision Josephson junction is insufficiently biased by the current from the second pulse alone, or because a logical decision Josephson junction is not triggered by the effect of such current).

A milliohm resistor as shown in any of FIGS. 1-5 can reduce circuit footprint size, increasing the circuit density and thereby reducing production costs. As discussed above, conventional resistor designs use very large parallel resistor structures consisting of ohm-level resistor layers to create sub-ohm resistors for use as a way to release SQUIDs that have latched up. A milliohm resistor as shown in any of FIGS. 1-5 thus saves significant design footprint.

Figure 7:
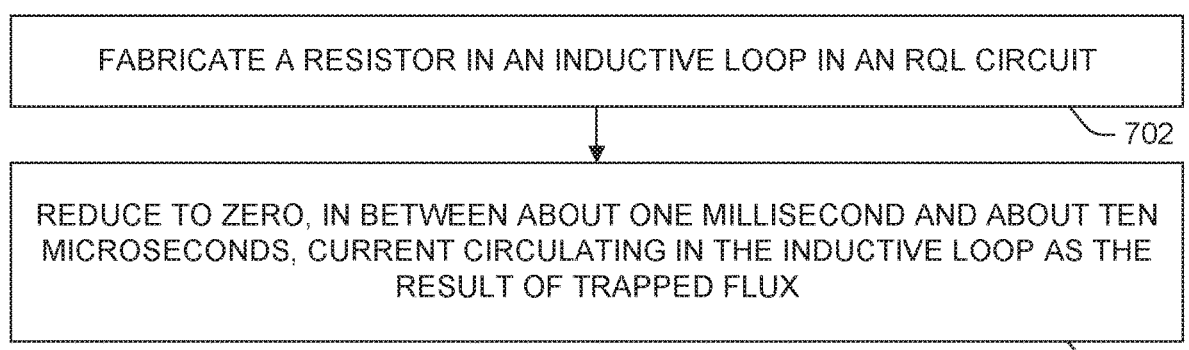
FIG. 7 is a flow diagram illustrating a method of mitigating flux trapping in an RQL circuit using a milliohm resistor.

FIG. 7 illustrates a method 700 of mitigating flux trapping in a reciprocal quantum logic (RQL) circuit. A resistor is fabricated 702 in an inductive loop in the RQL circuit. The resistor has a resistance of between about one milliohm and about fifty milliohms, and a footprint on the chip on which it is fabricated of less than twenty-five square micrometers. The resistor reduces 704 to zero, in between about one millisecond and about ten microseconds, current circulating in the inductive loop as the result of trapped flux. The resistor can be as described earlier with respect to FIGS. 1-5. The RQL circuit can be as described above with respect to FIG. 6.

The milliohm resistor devices described herein provide a unique fabrication area advantage over resistors of equivalent resistance made using conventional processes. The following table compares reduced integrated circuit footprint areas of example milliohm resistor devices as set forth in the present disclosure, termed "present devices" and fabricated as being circular in a plan view, to the much larger footprint areas required for conventional one-ohm-per-square and ten-ohm-per-square superconducting fabrication processes. The width and area values in the one-ohm-per-square and ten-ohm-per-square superconducting fabrication processes assume a minimum resistor length of about 0.5 micrometers, where "width" and "length" are dimensions in the x-y plane. Each different fabrication process defines the thickness z for its own manufacturing. The one-ohm-per-square and ten-ohm-per-square resistors, to which the present-device milliohm resistors are compared in the below table, are essentially wires of some metal, the z dimension thereof being fixed.

|  | Present devices (circular) | | 1 Ω/square process | | 10 Ω/square process | |
| --- | --- | --- | --- | --- | --- | --- |
| Resistance (mΩ) | Radius (μm) | Area (μm$^2$) | Width (μm) | Area (μm$^2$) | Width (μm) | Area (μm$^2$) |
| 1 | 1.78 | 9.95 | 500 | 250 | 5000 | 2500 |
| 10 | 0.56 | 0.99 | 50 | 25 | 500 | 250 |
| 25 | 0.36 | 0.41 | 20 | 10 | 200 | 100 |
| 50 | 0.25 | 0.2 | 10 | 5 | 100 | 50 |

As can be seen in the above table, the present devices, as described herein, provide an area advantage by roughly a factor of twenty-five over the one-ohm-per-square process, and by another factor of ten beyond that for the higher-resistance ten-ohm-per-square process. The milliohm resistors of the present disclosure are compatible with either of these processes and thus, by using the present devices, much smaller milliohm resistors can be fabricated on superconducting integrated circuits made using either of these conventional processes.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A resistor comprising:
   a first terminal made of a superconducting metal;
   a second terminal made of a superconducting metal; and
   a Josephson junction device electrically connected between the first and second terminals, the Josephson junction device comprising ferromagnetic or antiferromagnetic material,
   wherein the resistor has a resistance value of between about one milliohm and about fifty milliohms.

2. The resistor of claim 1, having a roughly square fabrication area, the area having a diameter of less than about five micrometers.

3. The resistor of claim 1, wherein the resistance value is between about one milliohm and about twenty milliohms.

4. The resistor of claim 1, wherein the resistance value is between about one milliohm and about five milliohms.

5. The resistor of claim 1, wherein the Josephson junction device comprises a synthetic antiferromagnet (SAF) barrier comprising two ferromagnetic layers separated by a spacer layer.

6. The resistor of claim 5, wherein the two ferromagnetic layers are made of the same material and are of about the same thickness.

7. The resistor of claim 6, wherein the two ferromagnetic layers are each at least 10 nanometers thick.

8. The resistor of claim 5, wherein the magnetizations of the two ferromagnetic layers are in an antiparallel alignment state with respect to each other.

9. The resistor of claim 5, wherein the spacer layer separating the two ferromagnetic layers is made of one of elemental copper, elemental ruthenium, elemental iridium, or elemental rhodium, and has a thickness of between about 0.5 nanometers and about one nanometer.

10. The resistor of claim 5, wherein the ferromagnetic layers are made of one of elemental cobalt, elemental iron, a cobaltiron alloy, a cobaltiron-boron alloy, a nickel-iron alloy, a nickel-iron-niobium alloy, a nickel-iron-chromium alloy, or a nickel-iron-copper alloy.

11. The resistor of claim 5, further comprising a first layer-growth-promoting outer spacer layer and a second layer-growth-promoting outer spacer layer, each outer spacer layer being arranged between a respective one of the ferromagnetic layers and a respective one of the terminals.

12. The resistor of claim 1, wherein the Josephson junction device comprises an antiferromagnetic barrier layer.

13. The resistor of claim 12, wherein the antiferromagnetic barrier layer is made of one of ferromanganese, ferrous oxide, ferric oxide, nickel(II) oxide, manganese(II) oxide, manganese(IV) oxide, chromium(III) oxide, or iridium manganese.

14. The resistor of claim 12, further comprising a first layer-growth-promoting outer spacer layer and a second layer-growth-promoting outer spacer layer, each outer spacer layer being arranged between the antiferromagnetic barrier layers and a respective one of the terminals.

15. The resistor of claim 12, wherein the antiferromagnetic barrier layer has a thickness of between about ten nanometers and about fifty nanometers.

16. A reciprocal quantum logic (RQL) circuit comprising the resistor of claim 1 in series with an inductive loop, the resistor being configured to mitigate flux trapping in the inductive loop.

17. A method of mitigating flux trapping in a reciprocal quantum logic (RQL) circuit, the method comprising:
fabricating a resistor in an inductive loop in the RQL circuit,
wherein the resistor has a resistance of between about one milliohm and about fifty milliohms,
wherein the resistor has a footprint of less than twenty-five square micrometers, and
wherein the resistor reduces to zero, in between about one millisecond and about ten microseconds, current circulating in the inductive loop as the result of trapped flux.

18. A chip-fabricated device comprising:
a first superconducting metal layer forming a first galvanic terminal;
a second superconducting metal layer forming a second galvanic terminal; and
between the superconducting metal layers, a barrier comprising one of:
a synthetic antiferromagnet (SAF) comprising two ferromagnetic material layers separated by a spacer layer, the ferromagnetic material layers arranged to have antiparallel magnetizations with respect to each other, or
an antiferromagnet layer;
wherein the device has a resistance of between about one milliohm and about fifty milliohms, and
wherein the device has a fabrication footprint of less than twenty-five square micrometers.

19. The device of claim 18,
wherein the barrier comprises the SAF,
wherein the ferromagnetic layers are each at least ten nanometers thick and are made of one of elemental cobalt, elemental iron, a cobalt-iron alloy, a cobalt-iron-boron alloy, a nickel-iron alloy, a nickel-iron-niobium alloy, a nickel-iron-chromium alloy, or a nickel-iron-copper alloy, and
wherein the spacer layer separating the two ferromagnetic layers is made of one of elemental copper, elemental ruthenium, elemental iridium, or elemental rhodium.

20. The device of claim 18,
wherein the barrier comprises the antiferromagnet layer, and
wherein the antiferromagnetic barrier layer is made of one of ferromanganese, ferrous oxide, ferric oxide, nickel (II) oxide, manganese(II) oxide, manganese(IV) oxide, chromium(III) oxide, or iridium manganese.

* * * * *